(12) United States Patent
Kinoshita

(10) Patent No.: US 7,902,454 B2
(45) Date of Patent: Mar. 8, 2011

(54) SOLAR CELL, SOLAR CELL MODULE, AND METHOD OF MANUFACTURING THE SOLAR CELL

(75) Inventor: Toshihiro Kinoshita, Katano (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 397 days.

(21) Appl. No.: 12/237,491

(22) Filed: Sep. 25, 2008

(65) Prior Publication Data

US 2010/0275964 A1    Nov. 4, 2010

(30) Foreign Application Priority Data

Sep. 28, 2007   (JP) ................. 2007-255420

(51) Int. Cl.
- *H02N 6/00* (2006.01)
- *H01L 31/042* (2006.01)
- *H01L 31/00* (2006.01)
- *H01L 21/00* (2006.01)

(52) U.S. Cl. ................ 136/256; 136/244; 438/96

(58) Field of Classification Search .............. 136/256, 136/244; 438/96
See application file for complete search history.

(56) References Cited

U.S. PATENT DOCUMENTS

| | | | | |
|---|---|---|---|---|
| 5,935,344 A | * | 8/1999 | Endo et al. ................ | 136/255 |
| 6,384,317 B1 | * | 5/2002 | Kerschaver et al. ........ | 136/256 |
| 2006/0219291 A1 | * | 10/2006 | Hikosaka et al. ............ | 136/251 |

FOREIGN PATENT DOCUMENTS

JP         64-082570 A         3/1989

* cited by examiner

*Primary Examiner* — Jeffrey T Barton
*Assistant Examiner* — Allison Bourke
(74) *Attorney, Agent, or Firm* — Marvin A. Motsenbocker; Mots Law, PLLC

(57) ABSTRACT

An i-type amorphous silicon layer 14 and a p-type amorphous silicon layer 15 are formed on a part of an inner wall of a through hole of an n-type single-crystal silicon substrate 11. Further, an i-type amorphous silicon layer 12 and an n-type amorphous silicon layer 13 are formed on a part of the inner wall of the through hole of the n-type single-crystal silicon substrate 11. The inner wall surface of the through hole is covered with the i-type amorphous silicon layer 14 and the i-type amorphous silicon layer 12.

5 Claims, 4 Drawing Sheets

SOLAR CELL, SOLAR CELL MODULE, AND METHOD OF MANUFACTURING THE SOLAR CELL

CROSS REFERENCE TO RELATED APPLICATIONS

This application is based upon and claims the benefit of priority from the prior Japanese Patent Application No. P 2007-255420, filed on Sep. 28, 2007; the entire contents of which are incorporated herein by reference.

BACKGROUND OF THE INVENTION

1. Field of the Invention

The present invention relates to a solar cell including a through hole formed on a semiconductor substrate, a solar cell module, and a method of manufacturing such solar cell.

2. Description of the Related Art

Solar cells are expected as a new energy source that can directly convert clean and inexhaustibly supplied sunlight into electricity.

In general, each solar cell can output an energy of several watts. Accordingly, as a power source for a house, a building or the like, it is common to use a solar cell module that includes a plurality of solar cells connected to one another in order to provide enhanced energy output. The plurality of solar cells arranged in arrangement directions is electrically connected to one another by using wiring members.

In recent years, there have been disclosed methods of providing both a positive electrode and a negative electrode on a back surface side of each of the plurality of solar cells in order to facilitate connection of solar cells (see, for example, Japanese Patent Application Publication No. 64-82570, hereinafter referred to as Patent Document 1). Such solar cells respectively include through holes that extend in directions orthogonal to main surfaces of the so semiconductor substrate. Photogenerated carriers collected by an electrode on the light-receiving surface side of the solar cells are guided to the back surface side of the solar cells through a conductor provided in the through hole.

Meanwhile, a solar cell having a HIT (heterojunction with intrinsic thin layer) structure is known as a solar cell having higher photoelectric conversion efficiency than a conventional crystalline solar cell. The HIT solar cell includes a p-type amorphous silicon layer provided on a light-receiving surface of an n-type crystalline silicon substrate and an n-type amorphous silicon layer provided on a back surface of the n-type crystalline silicon substrate. A substantially intrinsic i-type amorphous silicon layer is interposed between the n-type crystalline silicon substrate and the p-type amorphous silicon layer constituting a p-n junction region, and between the n-type crystalline silicon substrate and the n-type amorphous silicon layer constituting a BSF junction region. With this structure, it is possible to improve characteristics of each of the junction interfaces and thereby to obtain a high photoelectric conversion efficiency.

When this structure of the HIT solar cell is employed as the solar cell described in Patent Document 1, following problems are caused.

According to the solar cell disclosed in Patent Document 1, a SIN film is formed inside the through hole in order to suppress re-coupling of the photogenerated carriers on an inner wall surface of the through hole and to insulate the conductor provided inside the through hole from the electrode on the back surface. Such a SiN film is formed in a high-temperature processing at around 400° C. by a thermal CVD method and thereby exerts a passivation effect.

Meanwhile, the entire processing of manufacturing the HIT solar cell is performed at around 200° C. or lower in order to suppress the thermal damage to the semiconductor substrate. A SiN film formed at around 200° C. exerts an insulation characteristic. However, the SIN film formed at around 200° C. does not exert a favorable passivation effect. As a result, re-coupling of the photogenerated carriers on the inner wall surface of the through hole cannot be suppressed sufficiently, and the photoelectric conversion efficiency of the HIT solar cell is thereby degraded.

SUMMARY OF THE INVENTION

A first aspect of the present invention is summarized as a solar cell including a semiconductor substrate including a light-receiving surface, a back surface provided on an opposite side of the light-receiving surface, and a through hole penetrating the semiconductor substrate from the light-receiving surface to the back surface; a first light-receiving-surface-side amorphous semiconductor layer formed on the light-receiving surface of the semiconductor substrate and on a part of an inner wall of the through hole; a second light-receiving-surface-side amorphous semiconductor layer formed on the first light-receiving-surface-side amorphous semiconductor layer; a first back-surface-side amorphous semiconductor layer formed on the back surface of the semiconductor substrate and on a part of the inner wall of the through hole; a second back-surface-side amorphous semiconductor layer formed on the first back-surface-side amorphous semiconductor layer; and a conductor provided inside the through hole and insulated from the first back-surface-side amorphous semiconductor layer and the second back-surface-side amorphous semiconductor layer by use of an insulating layer. The first light-receiving-surface-side amorphous semiconductor layer and the first back-surface-side amorphous semiconductor layer have an i-type conductivity. The inner wall surface of the through hole is covered with the first light-receiving-surface-side amorphous semiconductor layer and the first back-surface-side amorphous semiconductor layer.

In the solar cell according to the first aspect of the present invention, the second back-surface-side amorphous semiconductor layer and the semiconductor substrate may have a same-type conductivity. On the inner wall surface of the through hole, an area covered with the first back-surface-side amorphous semiconductor layer may be larger than an area covered with the first light-receiving-surface-side amorphous semiconductor layer.

The solar cell according to the first aspect of the present invention may further include a back-surface-side transparent conductive film formed on the second back-surface-side amorphous semiconductor layer, and the back-surface-side transparent conductive film may be interposed between the second back-surface-side amorphous semiconductor layer and the insulating layer.

A second aspect of the present invention is summarized as a solar cell module including a plurality of solar cells provided in an arrangement direction; and a wiring member electrically connecting the plurality of solar cells to each other. Each of the plurality of solar cells includes: a semiconductor substrate including a light-receiving surface, a back surface provided on an opposite of the light-receiving surface, and a through hole penetrating the semiconductor substrate from the light-receiving surface to the back surface; a first light-receiving-surface-side amorphous semiconductor layer formed on the light-receiving surface of the semiconductor substrate and on a part of an inner wall of the through hole; a second light-receiving-surface-side amorphous semiconductor layer formed on the first light-receiving-surface-side amorphous semiconductor layer; a first back-surface-side amorphous semiconductor layer formed on the back surface of the semiconductor substrate and on a part of the inner wall of the through hole; a second back-surface-side amorphous semiconductor layer formed on the first back-surface-side amorphous semiconductor layer; and a conductor formed inside the through hole. The first light-receiving-surface-side amorphous semiconductor layer and the first back-surface-side amorphous semiconductor layer have an i-type conductivity. The conductor is insulated from the first back-surface-side amorphous semiconductor layer and the second back-surface-side amorphous semiconductor layer by use of an insulating layer. On a back surface side of the semiconductor substrate, the wiring member is electrically connected to the conductor.

A third aspect of the present invention is summarized as a method of manufacturing a solar cell, including: forming a through hole penetrating a semiconductor substrate from a light-receiving surface to a back surface provided on an opposite side of the light-receiving surface; sequentially forming, on the back surface of the semiconductor substrate, a first back-surface-side amorphous semiconductor layer and a second back-surface-side amorphous semiconductor layer; sequentially forming, on the light-receiving surface of the semiconductor substrate, a first light-receiving-surface-side amorphous semiconductor layer and a second light-receiving-surface-side amorphous semiconductor layer; and forming a conductor inside the through hole. The first light-receiving-surface-side amorphous semiconductor layer and the first back-surface-side amorphous semiconductor layer have an i-type conductivity. An insulating layer is formed to insulate the conductor from the first back-surface-side amorphous semiconductor layer and the second back-surface-side amorphous semiconductor layer.

DESCRIPTION OF THE PREFERRED EMBODIMENTS

Figure 1:
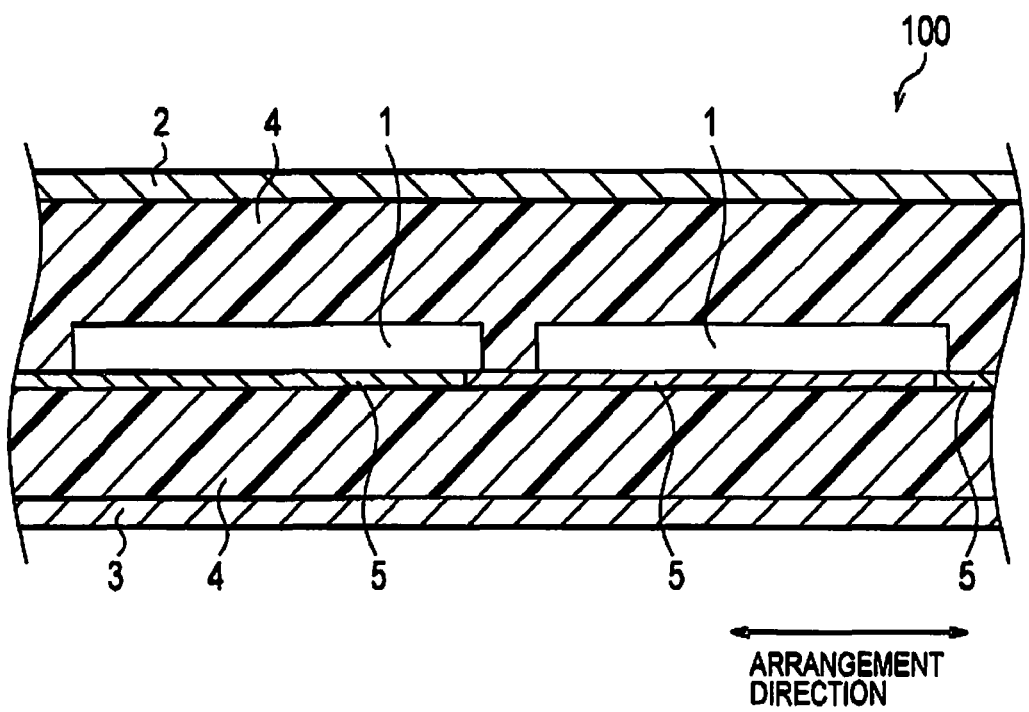
FIG. 1 is a sectional side view of a solar cell module 100 according to an embodiment of the present invention.

Hereinafter, an embodiment of the present invention will be described with reference to the accompanying drawings. In the following description of the drawings, identical or similar constituents are denoted by identical or similar reference numerals. It is to be noted, however, that the drawings are merely schematic and proportions of dimensions and the like may differ from actual ones. Therefore, concrete dimensions and the like should be determined in consideration of the following description. It is needless to say that dimensional relations or proportions may vary among the drawings.
(Schematic Configuration of Solar Cell Module)

A schematic configuration of a solar cell module 100 according to an embodiment of the present invention will be described with reference to FIG. 1. FIG. 1 is a side view showing the configuration of the solar cell module 100 according to this embodiment. As shown in FIG. 1, the solar cell module 100 of this embodiment includes a plurality of solar cells 1, a light-receiving-surface-side protective member 2, a back surface side protective member 3, a sealing member 4, and a wiring member 5. The plurality of solar cells 1 are sealed between the light-receiving-surface-side protective member 2 and the back surface side protective member 3 by use of the sealing member 4.

The plurality of solar cells 1 is connected to one another by use of the wiring member 5 and is arranged in arrangement directions. Each of the plurality of solar cells 1 includes a light-receiving surface (an upper side in the drawing) on which solar light is received and a back surface (a lower side in the drawing) provided on the opposite side of the light-receiving surface. The light-receiving surface and the back surface are main surfaces of each of the plurality of solar cells 1. Detailed description for the configuration of the plurality of solar cells 1 will be given later.

The wiring member 5 is provided only on the back surface of each of the plurality of solar cells 1. Therefore, the solar cell module 100 is a so-called back contact type solar cell module. In this way, the plurality of solar cells is electrically connected to each other. As the wiring member 5, a conductive material such as copper, which is formed either into a thin-plate shape or into a twisted-wire shape, may be used. Here, on a surface of thin-film copper or the like used as the wiring member 5, a soft conductive material such as eutectic solder may be plated.

The light-receiving-surface-side protective member 2 is provided on a light-receiving surface of the sealing member 4 and protects a top surface of the solar cell module 100. As the light-receiving-surface-side protective member 2, a glass having translucent and water-blocking properties, translucent plastic, and the like may be used.

The back-surface-side protective member 3 is provided on the back surface of the sealing member 4, and protects a back surface of the solar cell module 100. As the back-surface-side protective member 3, a resin film such as a PET (polyethylene terephthalate) film or a laminated film having a structure in which an Al foil is sandwiched therebetween, may be used.

The sealing member 4 seals the plurality of solar cells 1 between the light-receiving-surface-side protective member 2 and the back-surface-side protective member 3. As the sealing member 4, resins having translucency, such as EVA, EEA, PVB, silicone, urethane, acryl and epoxy may be used. However, the material is not limited only to the foregoing.

It should be noted that an Al frame (not shown) may be attached to an outer periphery of the solar cell module 100 having the above-described configuration.
(Configuration of Solar Cell)

Figure 2:
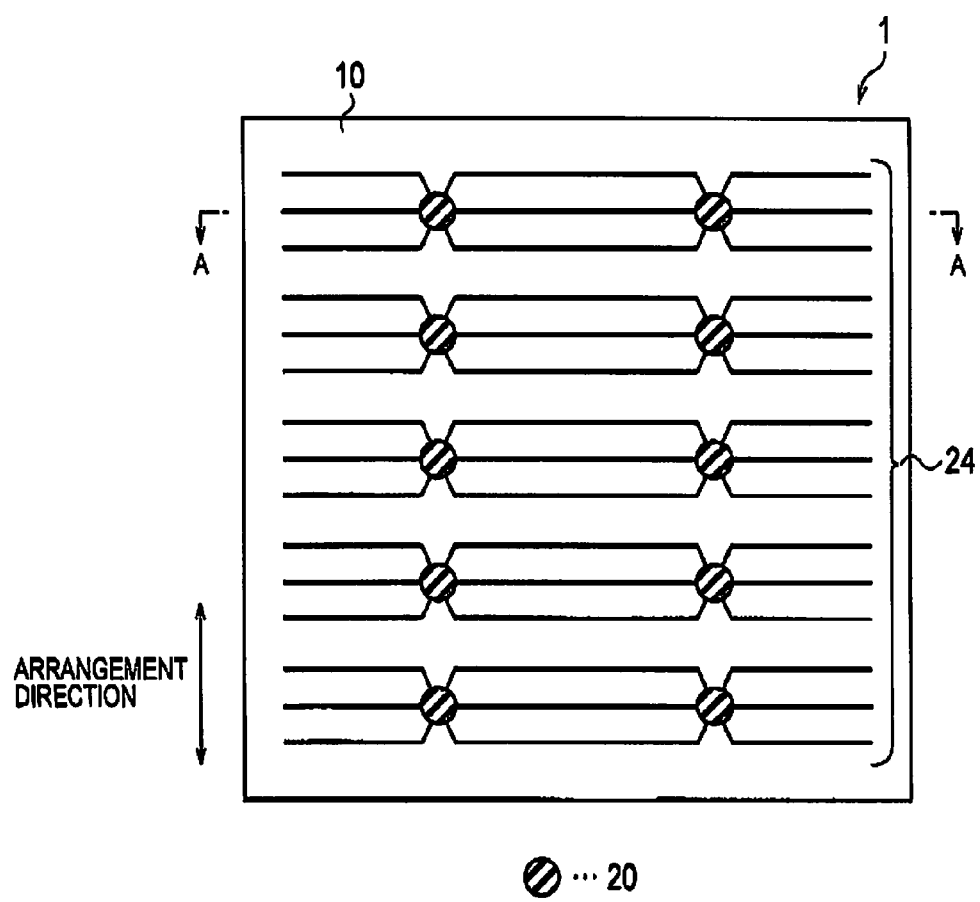
FIG. 2 is a plan view of a solar cell 1 of the embodiment of the present invention viewed from a light-receiving surface side.
Figure 3:
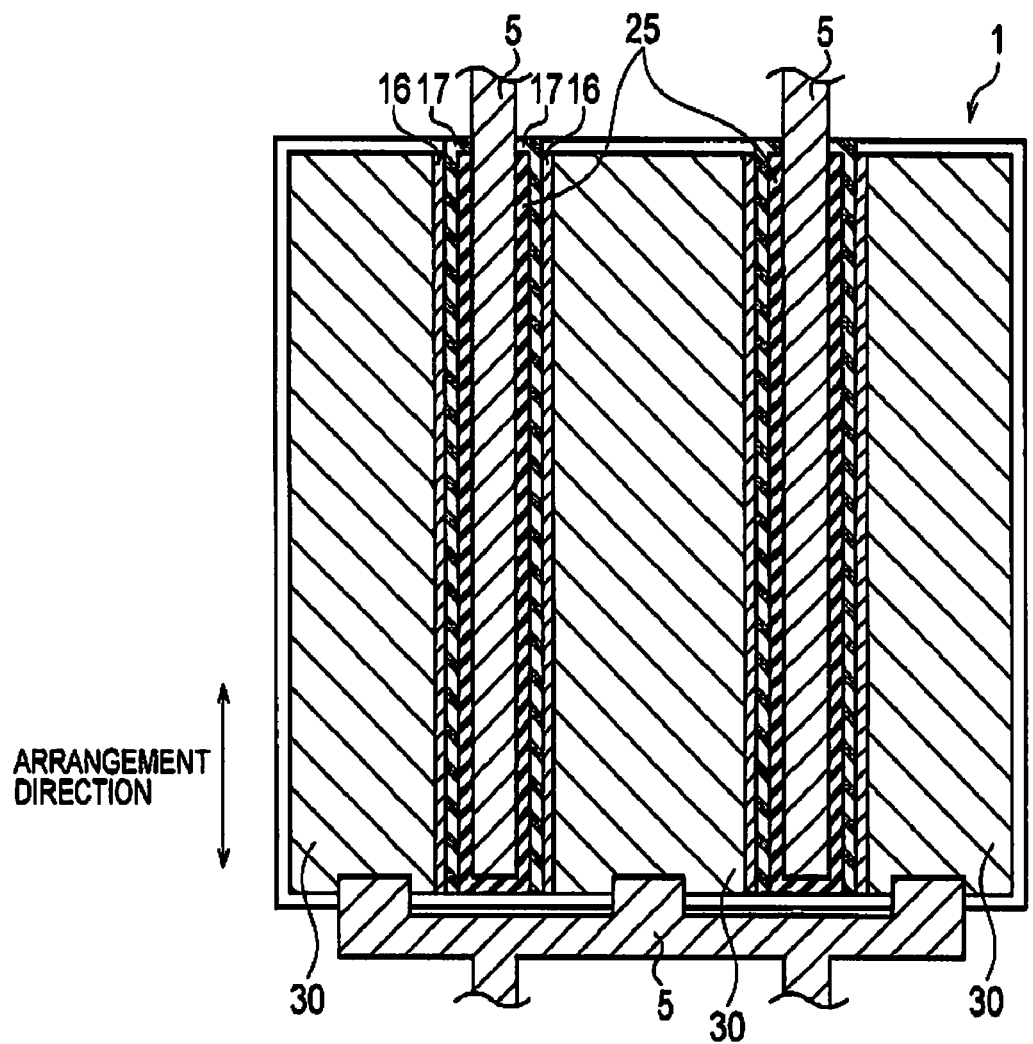
FIG. 3 is a plan view of the solar cell 1 of the embodiment of the present invention viewed from a back surface side.

Next, a configuration of each of the plurality of solar cells 1 will be described with reference to FIG. 2 and FIG. 3. FIG. 2 is a plan view of one of the plurality of solar cells 1 viewed from the light-receiving surface side. FIG. 3 is a plan view of one of the plurality of solar cells 1 viewed from the back surface side.

As shown in FIG. 2, one of the plurality of solar cells 1 includes a photoelectric conversion part 10, a light-receiving-surface-side collective electrode 24, and a conductor 20.

The photoelectric conversion part 10 has a light-receiving surface on which the light is received and a back surface provided on the opposite side of the light-receiving surface. The photoelectric conversion part 10 generates photogenerated carriers by receiving the solar light on a light-receiving surface. Here, the photogenerated carriers are referred to holes and electrons generated by the solar light absorbed by the photoelectric conversion part 10.

Here, the photoelectric conversion part 10 may include a structure (so-called a HIT structure) in which a substantially intrinsic amorphous silicon layer is interposed between a single-crystal silicon substrate and an amorphous silicon layer. Detailed configuration of the photoelectric conversion part 10 will be described later.

The light-receiving-surface-side collective electrode 24 is an electrode configured to collect the photogenerated carriers generated by the photoelectric conversion part 10. As shown in FIG. 2, a plurality of the light-receiving-surface-side collective electrode 24 is formed substantially on the entire light-receiving surface of the photoelectric conversion part 10. The light-receiving-surface-side collective electrodes 24 can be formed by use of a printing method using thermosetting conductor paste, for example. Here, the number and the shape of the light-receiving-surface-side collective electrodes 24 are modified appropriately in consideration of the size or the like of the photoelectric conversion part 10.

On the light-receiving surface of the photoelectric conversion part 10, the conductor 20 is electrically connected to the light-receiving-surface-side collective electrode 24. The photogenerated carriers generated by the photoelectric conversion part 10 and collected by the light-receiving-surface-side collective electrode 24 are collected by the conductor 20. The conductor 20 is provided inside a through hole (not shown in FIG. 2, see FIG. 4). The through hole is provided in the photoelectric conversion part 10 and penetrates the semiconductor substrate from the light-receiving surface to the back surface. Therefore, the photogenerated carriers collected by the conductor 20 are brought to the back surface side of the photoelectric conversion part 10. In this embodiment, a plurality of the conductor 20 is arranged along the arrangement direction. However, the number of the conductor 20 is modified appropriately in consideration of the number of the light-receiving-surface-side collective electrodes 24, resistance ratio of the conductive material composing each of the conductor 20, and the like. The conductor 20 is made of a conductive material similar to the light-receiving-surface-side collective electrodes 24.

As shown in FIG. 3, the one of the plurality of solar cells 1 includes a light-receiving-surface-side bus bar electrode 25 and a back surface side collective electrode 30.

The light-receiving-surface-side bus bar electrode 25 is provided on the back surface of the photoelectric conversion part 10 and configured to collect the photogenerated carriers from the conductor 20. As shown in FIG. 3, the light-receiving-surface-side bus bar electrode 25 is formed into a line shape along the arrangement direction. The light-receiving-surface-side bus bar electrode 25 may be formed by use of a material similar to the light-receiving-surface-side collective electrode 24.

As shown in FIG. 3, the wiring member 5 is disposed on the light-receiving-surface-side bus bar electrodes 25 along the arrangement direction. One end of the wiring member 5 is electrically connected to the back surface side collective electrode 30 of another one of the plurality of solar cell 1, which is adjacent to the one of the plurality of solar cells 1. In this way, the plurality of solar cells 1 is electrically connected to each other in series.

The back surface side collective electrode 30 collects, from the photoelectric conversion part 10, photogenerated carriers having a different polarity from the photogenerated carriers collected by the light-receiving-surface-side bus bar electrode 25. The back surface side collective electrode 30 is formed on the back surface of the photoelectric conversion part 10 where the light-receiving-surface-side bus bar electrodes 25 are not formed. More specifically, the back surface side collective electrode 30 is formed on a back surface side transparent conductive film 16 (see FIG. 4). It is to be noted, however, that the present invention does not limit the shape and the like of the collective electrodes formed on the back surface of the photoelectric conversion part 10.

Here, the photogenerated carriers collected by the back surface side collective electrode 30 and the back surface side transparent conductive film 16 have different polarity from the photogenerated carriers collected by the light-receiving-surface-side bus bar electrode 25 and the conductor 20. Here, an insulating layer 17 electrically insulates the back surface side collective electrode 30 and the back surface side transparent conductive film 16 from the conductor 20 and the light-receiving-surface-side bus bar electrodes 25.

(Configuration of Photoelectric Conversion Part)

Figure 4:
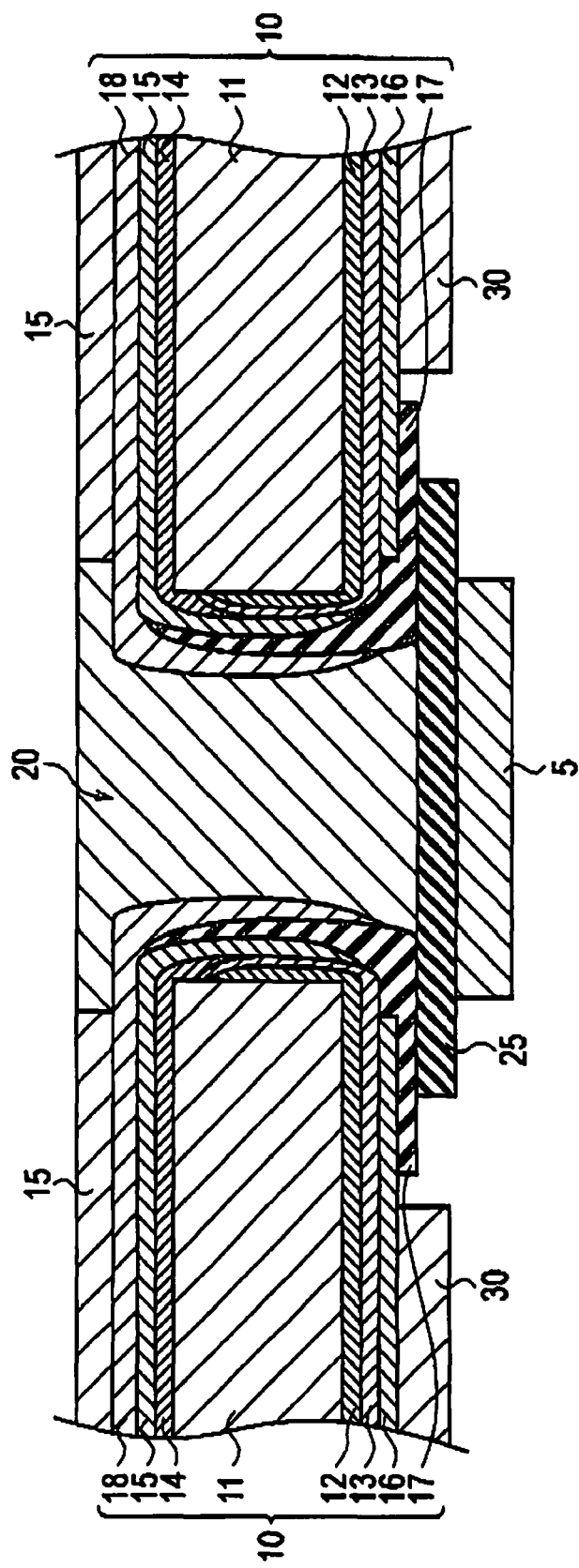
FIG. 4 is an enlarged cross-sectional view taken along an A-A line in FIG. 2.

Next, a detailed configuration of the photoelectric conversion part 10 included in each of the plurality of solar cells 1 will be described with reference to FIG. 4. FIG. 4 is an enlarged cross-sectional view taken along an A-A line in FIG. 2.

The photoelectric conversion part 10 includes an n-type single-crystal silicon substrate 11, an i-type amorphous silicon layer 12, an n-type amorphous silicon layer 13, an i-type amorphous silicon layer 14, a p-type amorphous silicon layer 15, a back surface side transparent conductive film 16, an insulating layer 17, and a light-receiving-surface-side transparent conductive film 18.

The n-type single-crystal silicon substrate 11 includes a light-receiving surface, a back surface provided on an opposite side of the light-receiving surface, and a through hole penetrating the semiconductor substrate from the light-receiving surface to the back surface. As shown in FIG. 4, a conductor 20 is provided inside the through hole. Meanwhile, fine textures (not shown) are formed on the light-receiving surface and the back surface of the n-type single-crystal silicon substrate 11.

The i-type amorphous silicon layer 12 is formed on the back surface of the n-type single-crystal silicon substrate 11. The i-type amorphous silicon layer 12 is extremely thin and substantially intrinsic.

The n-type amorphous silicon layer 13 is formed on the back surface of the i-type amorphous silicon layer 12 by a CVD method. The i-type amorphous silicon layer 12 and the n-type amorphous silicon layer 13 collectively constitute a so-called BSF structure.

The i-type amorphous silicon layer 14 is formed on the light-receiving surface of the n-type single-crystal silicon substrate 11. The i-type amorphous silicon layer 14 is extremely thin and substantially intrinsic. An inner wall surface of the through hole is covered with the i-type amorphous silicon layer 12 and the i-type amorphous silicon layer 14.

The p-type amorphous silicon layer 15 is formed on a light-receiving surface of the i-type amorphous silicon layer 14 by the CVD method. A semiconductor p-n junction is thus formed by the p-type amorphous silicon layer 15 and the n-type single-crystal silicon substrate 11.

The back surface side transparent conductive film 16 is formed on a back surface of the n-type amorphous silicon layer 13 by a PVD method such as a sputtering method or an evaporation method. As the back surface side transparent conductive film 16, an oxide of In, Zn, Sn, Ti, W or the like having conductivity can be used.

Here, in this embodiment, the back surface side transparent conductive film 16 is formed, on the back surface of the n-type single-crystal silicon substrate 11, where the through hole is not formed.

The insulating layer 17 insulates the conductor 20 and the light-receiving-surface-side transparent conductive film 18 (to be described later) from the silicon substrate 11, the i-type amorphous silicon layer 12, the n-type amorphous silicon layer 13, and the back surface side transparent conductive film 16. Accordingly, as shown in FIG. 4, a part of the insulating layer 17 is formed on the back surface of the back surface side transparent conductive film 16.

The light receiving side transparent conductive film 18 is formed on a light-receiving surface side of the p-type amorphous silicon layer 15 by the PVD method such as the sputtering method or the evaporation method. The light receiving side transparent conductive film 18 may be made of the same material as the back surface side transparent conductive film 16.

Here, in this embodiment, the i-type amorphous silicon layer 12 and the n-type amorphous silicon layer 13 are partially formed on the inner wall surface of the through hole. In other words, the i-type amorphous silicon layer 12 and the n-type amorphous silicon layer 13 are formed to extendedly cover the back surface of the n-type single-crystal silicon substrate 11 and a part of the inner wall surface of the through hole. Similarly, the i-type amorphous silicon layer 14 and the p-type amorphous silicon layer 15 are partially formed on the inner wall surface of the through hole. In other words, the i-type amorphous silicon layer 14 and the p-type amorphous silicon layer 15 are formed to extendedly cover the light-receiving surface of the n-type single-crystal silicon substrate 11 and a part of the inner wall surface of the through hole.

Meanwhile, in the inside of the through hole, the i-type amorphous silicon layer 12 and the n-type amorphous silicon layer 13 are formed between the inner wall surface (the n-type single-crystal silicon substrate 11) and the i-type amorphous silicon layer 14. Moreover, the i-type amorphous silicon layer 12 and the n-type amorphous silicon layer 13 are formed towards a light-receiving-surface-side end on the inner wall surface of the through hole. Therefore, as shown in FIG. 4, the area of the inner wall surface of the through hole covered with the i-type amorphous silicon layer 12 is larger than the area of the inner wall surface of the through hole covered with the i-type amorphous silicon layer 14.

(Method of Manufacturing Solar Cell)

A method of manufacturing each of the plurality of solar cells 1 according to this embodiment will be described with reference to FIG. 4.

(1) Formation of Through Hole

An n-type single-crystal thin plate is cut out of an n-type single-crystal silicon ingot. A through hole penetrating from the light-receiving surface to the back surface of the n-type single-crystal silicon thin plate is formed, thereby the n-type single-crystal silicon substrate 11 is formed.

The through hole can be made by applying a wet etching method using hydrofluoric-nitric acid or an alkaline solution, a dry etching method using gas such as $Cl_2$, $CF_4$ or $BCl_3$, laser abrasion, or mechanical processing using a drill, sandblast or the like.

Here, the laser abrasion processing is suitably used since it does not require forming a resist pattern on the silicon substrate. The laser abrasion may apply a laser such as a Nd:YAG layer.

(2) Cleaning Process and Texture Process

Next, the light-receiving surface and the back surface of the n-type single-crystal silicon substrate 11 and the inner wall surface thereof are cleaned with an acid or an alkaline solution in order to remove unnecessary metal and organic substances on these surfaces. Subsequently, an anisotropic etching processing with an alkaline aqueous solution is performed and thus a fine texture processing is performed on the surface of the n-type single-crystal silicon substrate 11.

(3) Forming the P-Type Layers and N-Type Layers

The i-type amorphous silicon layer 12 and the n-type amorphous silicon layer 13 are sequentially formed on the back surface of the n-type single-crystal silicon substrate 11 by the CVD (chemical vapor deposition) method. Here, in this embodiment, since the though hole is not masked, the i-type amorphous silicon layer 12 and the n-type amorphous silicon layer 13 are formed inside the through hole.

Subsequently, the i-type amorphous silicon layer 14 and the p-type amorphous silicon layer 15 are sequentially formed on the light-receiving surface of the n-type single-crystal silicon substrate 11 by the CVD method. Here, in this embodiment, since the though hole is not masked, the i-type amorphous silicon layer 14 and the p-type amorphous silicon layer 15 are formed inside the through hole.

(4) Forming the Transparent Conductive Films

Generally, the PVD (physical vapor deposition) method such as the evaporation method, the sputtering method or an ion-plating method is used as a method of forming the transparent conductive film.

First, a back-surface-side opening portion of the through hole is masked. Then, the back surface side transparent conductive film 16 is formed, on the back surface of the n-type amorphous silicon layer 13, where the through hole is not formed.

Next, the back-surface-side opening portion of the through hole is masked. Then, the insulating layer 17 is formed inside the through hole. Here, SiO, SiN, and the like may be used as the insulating layer 17. The back surface side transparent conductive film 16 is interposed between the insulating layer 17 and the n-type amorphous silicon layer 13 in the circumference of the through hole.

Next, the light-receiving-surface-side transparent conductive film 18 is formed on the light-receiving surface of the p-type amorphous silicon layer 15. Since the insulating layer 17 is formed inside the through hole, the light-receiving-surface-side transparent conductive film 18 is formed without masking the through hole.

(5) Forming the Conductor

The light-receiving-surface-side collective electrodes 24 are formed on the light-receiving-surface-side transparent conductive film 18 by using a screen printing or the like. The back surface side collective electrodes 30 are formed on the back surface side transparent conductive film 16 by using the screen printing or the like. A conductor 20 is formed inside the through hole. The light-receiving-surface-side collective electrode 24, the back surface side collective electrode 30, and the conductor 20 can be formed by use of thermo-setting conductor paste, for example.

Any one of the process of forming the light-receiving-surface-side collective electrodes 24 by screen printing or the like and the process of forming the back surface side collective electrodes 30 by screen printing or the like can be performed simultaneously with the process of forming the conductor 20. Here, it is also possible to divide these processes into multiple stages such as forming any of the light-receiving-surface-side collective electrodes 24 and the back surface side collective electrodes 30 after forming the conductor 20, or vice versa.

The light-receiving-surface-side bus bar electrode 25 is formed on the insulating layer 17. Meanwhile, the back surface side collective electrodes 30 are formed on the back surface of the back surface side transparent conductive film 18. The back surface side collective electrodes 30 can be formed by the screen printing method. However, without limitations to the foregoing, the evaporation method or the sputtering method may also be used.

(Operations and Effects)

According to each of the plurality of solar cells 1 of this embodiment, the i-type amorphous silicon layer 14 and the p-type amorphous silicon layer 15 are formed on the part of the inner wall of the through hole of the n-type single-crystal silicon substrate 11. Further, the i-type amorphous silicon layer 12 and the n-type amorphous silicon layer 13 are formed on the part of the inner wall of the through hole of the n-type single-crystal silicon substrate 11. The inner wall surface of the through hole is covered with the i-type amorphous silicon layer 14 and the i-type amorphous silicon layer 12.

As described above, according to the solar cell 1 of this embodiment, the inner wall surface of the through hole is covered with the i-type amorphous semiconductor layers (i-type amorphous silicon layer 12 and i-type amorphous silicon layer 14). Here, the i-type amorphous semiconductor layers contain hydrogen inside the layers so that the layers have a high passivation performance relative to the single-crystal semiconductor substrate. Therefore, the i-type amorphous semiconductor layers have both the functions as the insulating layer and as the passivation layer. As a result, re-coupling of the photogenerated carriers on the inner wall surface of the through hole can be suppressed, thereby the conversion efficiency of each of the plurality of solar cells 1 can be improved.

Moreover, each of the plurality of solar cells 1 of this embodiment has the HIT structure. Accordingly, by providing the n-type single-crystal silicon substrate 11 having the through hole in advance, the i-type amorphous silicon layers can be easily formed on the inner wall surface of the through hole.

Further, the n-type amorphous silicon layer 13 formed on the back surface has the same conductive type as the n-type silicon substrate 11. In the inner wall surface of the through hole, the area covered with the i-type amorphous silicon layer 12 is larger than the area covered with the i-type amorphous silicon layer 14. Here, the i-type amorphous silicon layer 12 is formed on the back surface of the n-type silicon substrate 11, and the i-type amorphous silicon layer 14 is formed on the light-receiving surface of the n-type single-crystal silicon substrate 11. Accordingly, more favorable BSF effect can be achieved; thereby the conversion efficiency of each of the plurality of solar cells 1 can be further improved.

In addition, the back surface side transparent conductive film 16 is formed prior to formation of the insulating layer 17. Therefore, the insulating layer 17 is formed on the back surface side transparent conductive film 16. This makes it possible to form the back surface side transparent conductive film 16 substantially on the entire back surface of the n-type single-crystal silicon substrate 11, and to improve the collection efficiency of the photogenerated carriers from the photoelectric conversion part 10.

(Other Embodiments)

Various other modifications are possible without departing from the above-described scope of the present invention. It is to be understood that the description and the drawings constituting part of this disclosure will not limit the present invention.

For example, in the embodiment, the description is given for the plurality of solar cells each including the p-type amorphous silicon layer provided on the light-receiving surface of the n-type single-crystal silicon substrate and the n-type amorphous silicon layer provided on the back surface of the substrate. However, without limitations to the foregoing, it is also possible to form a solar cell including an n-type amorphous silicon layer provided on a light-receiving surface of a p-type single-crystal silicon substrate and a p-type amorphous silicon layer provided on a back surface of the substrate.

EXAMPLES

Now, the solar cell of the present invention will be concretely described with reference to an example. However, the present invention will not be limited only to the example to be described below and various modifications are possible without departing from the scope of the invention.

Example

A plurality of through holes was formed on an n-type single-crystal silicon substrate by use of a LD-excitation rod-type Nd:YAG laser having a wavelength of 532 mm.

Next, an i-type amorphous silicon layer, an n-type amorphous silicon layer, and an ITO film were sequentially formed on the back surface of the n-type single-crystal silicon substrate 11 by a CVD (chemical vapor deposition) method without masking the through hole. Here, concentration of a dopant (P) on the inner surface of the through hole was $1.0 \times 10^{18}$ cm$^{-3}$.

Subsequently, an i-type amorphous silicon layer, a p-type amorphous silicon layer, and an ITO film were sequentially formed on the light-receiving surface of the n-type single-crystal silicon substrate 11 by the CVD method without masking the through hole. Here, concentration of a dopant (B) on the inner surface of the through hole was $1.0 \times 10^{18}$ cm$^{-3}$.

In this way, a solar cell having the HIT structure of the example was formed.

Comparative Example

A solar cell having the HIT structure was formed in a similar manner to the above-described example excluding the formation of the through holes. The through holes were formed thereafter by use of a YAG laser.

Subsequently, an SiN film was formed on an inner surface of each through of the through holes at a temperature equal to or less than 200° C. so as not to affect the amorphous silicon layers.

(Comparison of Cell Characteristics)

TABLE 1

| | Voc (V) | Isc (mA/cm$^2$) | FF | Eff (%) |
|---|---|---|---|---|
| Example | 0.70 | 37.7 | 0.78 | 20.6 |
| Comparative Example | 0.70 | 37.6 | 0.76 | 20.0 |

As shown in the table 1, the conversion efficiency of the solar cell according to the example showed a higher value than the comparative example.

This result is attributed to the fact that the solar cell according to the example could exert a favorable passivation effect by forming the i-type amorphous semiconductor layers on the inner surface of the through hole.

By contrast, in the comparative example, a favorable passivation effect was not achieved because the SiN film was formed at the temperature equal to or less than 200° C.

From this result, it was confirmed that the conversion efficiency of the solar cell was improved by covering the inner wall surface of the through hole with the i-type amorphous semiconductor layers.

What is claimed is:

1. A solar cell, comprising:
a semiconductor substrate including a light-receiving surface, a back surface provided on an opposite side of the light-receiving surface, and a through hole penetrating the semiconductor substrate from the light-receiving surface to the back surface;
a first light-receiving-surface-side amorphous semiconductor layer formed on the light-receiving surface of the semiconductor substrate and on a part of an inner wall of the through hole;
a second light-receiving-surface-side amorphous semiconductor layer formed on the first light-receiving-surface-side amorphous semiconductor layer;
a first back-surface-side amorphous semiconductor layer formed on the back surface of the semiconductor substrate and on a part of the inner wall of the through hole;
a second back-surface-side amorphous semiconductor layer formed on the first back-surface-side amorphous semiconductor layer; and
a conductor provided inside the through hole and insulated from the first back-surface-side amorphous semiconductor layer and the second back-surface-side amorphous semiconductor layer by use of an insulating layer, wherein
the first light-receiving-surface-side amorphous semiconductor layer and the first back-surface-side amorphous semiconductor layer have an i-type conductivity, and
the inner wall surface of the through hole is covered with the first light-receiving-surface-side amorphous semiconductor layer and the first back-surface-side amorphous semiconductor layer.

2. The solar cell according to claim 1, wherein
the second back-surface-side amorphous semiconductor layer and the semiconductor substrate have a same-type conductivity, and
on the inner wall surface of the through hole, an area covered with the first back-surface-side amorphous semiconductor layer is larger than an area covered with the first light-receiving-surface-side amorphous semiconductor layer.

3. The solar cell according to claim 1, further comprising
a back-surface-side transparent conductive film formed on the second back-surface-side amorphous semiconductor layer, wherein
the back-surface-side transparent conductive film is interposed between the second back-surface-side amorphous semiconductor layer and the insulating layer.

4. A solar cell module, comprising:
a plurality of solar cells provided in an arrangement direction; and
a wiring member electrically connecting the plurality of solar cells to each other, wherein
each of the plurality of solar cells includes:
a semiconductor substrate including a light-receiving surface, a back surface provided on an opposite of the light-receiving surface, and a through hole penetrating the semiconductor substrate from the light-receiving surface to the back surface;
a first light-receiving-surface-side amorphous semiconductor layer formed on the light-receiving surface of the semiconductor substrate and on a part of an inner wall of the through hole;
a second light-receiving-surface-side amorphous semiconductor layer formed on the first light-receiving-surface-side amorphous semiconductor layer;
a first back-surface-side amorphous semiconductor layer formed on the back surface of the semiconductor substrate and on a part of the inner wall of the through hole;
a second back-surface-side amorphous semiconductor layer formed on the first back-surface-side amorphous semiconductor layer; and
a conductor formed inside the through hole, and
the first light-receiving-surface-side amorphous semiconductor layer and the first back-surface-side amorphous semiconductor layer have an i-type conductivity,
the conductor is insulated from the first back-surface-side amorphous semiconductor layer and the second back-surface-side amorphous semiconductor layer by use of an insulating layer, and
on a back surface side of the semiconductor substrate, the wiring member is electrically connected to the conductor.

5. A method of manufacturing a solar cell, comprising:
forming a through hole penetrating a semiconductor substrate from a light-receiving surface to a back surface provided on an opposite side of the light-receiving surface;
sequentially forming, on the back surface of the semiconductor substrate, a first back-surface-side amorphous semiconductor layer and a second back-surface-side amorphous semiconductor layer, such that the first back-surface-side amorphous semiconductor layer is formed on a part of the inner wall of the through hole;
sequentially forming, on the light-receiving surface of the semiconductor substrate, a first light-receiving-surface-side amorphous semiconductor layer and a second light-receiving-surface-side amorphous semiconductor layer, such that the first light-receiving-surface-side amorphous semiconductor layer is also formed on a part of the inner wall of the through hole;
forming a conductor inside the through hole, wherein
the first light-receiving-surface-side amorphous semiconductor layer and the first back-surface-side amorphous semiconductor layer have an i-type conductivity, and
an insulating layer is formed to insulate the conductor from the first back-surface-side amorphous semiconductor layer and the second back-surface-side amorphous semiconductor layer.

* * * * *